US010843567B2

(12) United States Patent
Nishikawa et al.

(10) Patent No.: US 10,843,567 B2
(45) Date of Patent: Nov. 24, 2020

(54) MONITORING SYSTEM

(71) Applicant: SANYO Electric Co., Ltd., Daito (JP)

(72) Inventors: Masato Nishikawa, Hyogo (JP);
Kimihiko Furukawa, Hyogo (JP);
Hidetsugu Mukae, Hyogo (JP); Shinya Inui, Hyogo (JP); Tomonori Kawamoto, Hyogo (JP)

(73) Assignee: SANYO ELECTRIC CO., LTD., Daito (JP)

( * ) Notice: Subject to any disclaimer, the term of this patent is extended or adjusted under 35 U.S.C. 154(b) by 0 days.

(21) Appl. No.: 16/500,975

(22) PCT Filed: Mar. 26, 2018

(86) PCT No.: PCT/JP2018/011968
§ 371 (c)(1),
(2) Date: Oct. 4, 2019

(87) PCT Pub. No.: WO2018/190107
PCT Pub. Date: Oct. 18, 2018

(65) Prior Publication Data
US 2020/0033418 A1   Jan. 30, 2020

(30) Foreign Application Priority Data
Apr. 11, 2017  (JP) ................. 2017-078316

(51) Int. Cl.
*B60L 3/00*  (2019.01)
*G01R 31/3835*  (2019.01)

(52) U.S. Cl.
CPC ............ *B60L 3/00* (2013.01); *G01R 31/3835* (2019.01)

(58) Field of Classification Search
CPC .................. B60L 3/00; G01R 31/3835
(Continued)

(56) References Cited

U.S. PATENT DOCUMENTS 4,374,380 A * 2/1983 Giepen ................. H02J 7/166
322/99
6,208,242 B1 * 3/2001 Engelmann ............ B60T 8/885
318/563

(Continued)

FOREIGN PATENT DOCUMENTS

| JP | 2011-234506 A | 11/2011 |
| JP | 2014-48281 A | 3/2014 |
| JP | 2014-169883 A | 9/2014 |

OTHER PUBLICATIONS

International Search Report dated Jun. 19, 2018, issued in counterpart Application No. PCT/JP2018/011968 (2 pages).

*Primary Examiner* — Bentsu Ro
(74) *Attorney, Agent, or Firm* — Westerman, Hattori, Daniels & Adrian, LLP

(57) ABSTRACT

A monitoring system includes: a first monitor that receives, from a first output terminal, a voltage detected by a voltage detector and information on a circuit failure; a second monitor that receives, from a second output terminal, an abnormal voltage signal detected by the voltage detector; and a vehicle controller that electrically disconnects a driving motor from an electricity storing unit. When a circuit failure occurs in one circuit of a circuit on a side of the first output terminal and a circuit on a side of the second output terminal and a circuit failure does not occur in the other circuit, and the electricity storing unit is normal, the vehicle controller connects the driving motor with the electricity storing unit.

3 Claims, 6 Drawing Sheets

(58) Field of Classification Search
USPC .......................................................... 318/560
See application file for complete search history.

(56) References Cited

U.S. PATENT DOCUMENTS

| | | | | |
|---|---|---|---|---|
| 2006/0043933 A1* | 3/2006 | Latinis | ............... | G01R 31/3835 |
| | | | | 320/132 |
| 2010/0079271 A1* | 4/2010 | Hsu | ....................... | H02J 7/0029 |
| | | | | 340/455 |
| 2011/0260687 A1 | 10/2011 | Kudo et al. | | |
| 2013/0278272 A1* | 10/2013 | Kaminski | ............. | B60L 3/0069 |
| | | | | 324/510 |
| 2014/0375327 A1* | 12/2014 | Sievers | ............... | G01R 19/0084 |
| | | | | 324/503 |
| 2015/0130471 A1* | 5/2015 | Bolduc | .............. | G01R 31/3835 |
| | | | | 324/427 |

* cited by examiner

FIG. 3

|  | First monitor | Second monitor |
|---|---|---|
| Interface | First output terminal | Second output terminal |
| Circuit failure information | ○ | — |
| Voltage | ○ | — |
| Voltage abnormality | — | ○ |

FIG. 5

| First monitor (voltage abnormality) | Second monitor (voltage abnormality) | Circuit on side of first output terminal (circuit failure) | Circuit on side of second output terminal (circuit failure) | Vehicle controller (corresponding procedure) | limitation of operation |
|---|---|---|---|---|---|
| | | X | | Continuation of driving | Limitation of output torque Limitation of duration for operating or driving distance |
| | | | X | Continuation of driving | Limitation of output torque Limitation of duration for operating or driving distance |
| | | X | X | Relay open | Driving stop |
| X | | | | Relay open | Driving stop |
| | X | | | Relay open | Driving stop |
| X | X | | | Relay open | Driving stop |

FIG. 6

| Case | #1 | #2 | #3 | #4 |
|---|---|---|---|---|
| Voltage abnormality | No | No | Occurrence | Occurrence |
| Voltage | Within normal range | Out of normal range | Within normal range | Out of normal range |
| Determination | Normality | Circuit failure | Circuit failure | Abnormality |

MONITORING SYSTEM

TECHNICAL FIELD

The present invention relates to a monitoring system that monitors an electricity storing unit attached to a vehicle.

BACKGROUND ART

PTL 1 discloses a monitoring device that includes a main detecting circuit and a subsidiary detecting circuit that each detect voltages of electricity storing cells, main detection lines that connect the electricity storing cells with the main detecting circuit, and subsidiary detection lines that connect the electricity storing cells with the subsidiary detecting circuit. In the monitoring device, at least part of the main detection lines and at least part of the subsidiary detection lines are separate from each other, and are thus electrically independent from each other. In the monitoring device, a main microcomputer controls the main detecting circuit, and a subsidiary microcomputer controls the subsidiary detecting circuit. The main microcomputer determines whether or not the main detection lines break. The subsidiary microcomputer determines whether or not the subsidiary detection lines break.

CITATION LIST

Patent Literature

PTL 1: Unexamined Japanese Patent Publication No. 2014-169883

SUMMARY OF THE INVENTION

In the monitoring device disclosed in PTL 1, a main-microcomputer system is independent from a subsidiary-microcomputer system. For example, detection lines that connect the main-microcomputer system with the electricity storing cells are independent from detection lines that connect the subsidiary-microcomputer system with the electricity storing cells. Consequently, system redundancy is increased. However, the circuit becomes complicated, and a size of the circuit becomes large.

In some cases, a failure occurs in voltage detectors of the electricity storing cells, but a failure does not occur in the electricity storing cells themselves, and a vehicle can drive without any problem. It has been desired to allow the vehicle in such a case to continue to drive while operation of a driving motor is limited although the electricity storing cells are not sufficiently monitored.

The present invention is made considering the above situation. It is an object of the present invention to provide a monitoring system that does not increase a size of a circuit that monitors an electricity storing unit and allows a vehicle to continue to drive.

A monitoring system according to an aspect of the present invention includes: a voltage detector that detects a voltage of an electricity storing unit attached to a vehicle, and includes a first output terminal that outputs the detected voltage and information on a circuit failure in a circuit of the voltage detector, and a second output terminal that outputs an abnormal voltage signal that shows that the detected voltage is abnormal or is not abnormal; a first monitor that is connected to the first output terminal, and receives the voltage and the information on a circuit failure that are output by the first output terminal; a second monitor that is connected to the second output terminal, and receives the abnormal voltage signal output by the second output terminal; and a vehicle controller that electrically disconnects a driving motor from the electricity storing unit, based on notifications from the first monitor and the second monitor. When a circuit failure occurs in both of a circuit on a side of the first output terminal and a circuit on a side of the second output terminal, the vehicle controller disconnects the driving motor from the electricity storing unit. Alternatively, when a circuit failure occurs in one circuit of the circuits and a circuit failure does not occur in the other circuit, and the electricity storing unit is normal, the vehicle controller connects the driving motor with the electricity storing unit.

Advantageous Effects of Invention

According to the present invention, a size of a circuit that monitors an electricity storing unit is not increased, and a vehicle is allowed to continue to drive.

BRIEF DESCRIPTION OF DRAWINGS

FIG. 3 is a table that illustrates information a first monitor and a second monitor each receive from the voltage detectors.

FIG. 5 is a table that illustrates contents of procedures of the vehicle controller, and the procedures of the vehicle controller correspond to monitored states, respectively.

FIG. 6 is a table that illustrates examples of determination of circuit failures each based on voltages and an abnormal voltage in a modified example.

DESCRIPTION OF EMBODIMENT

Figure 1:
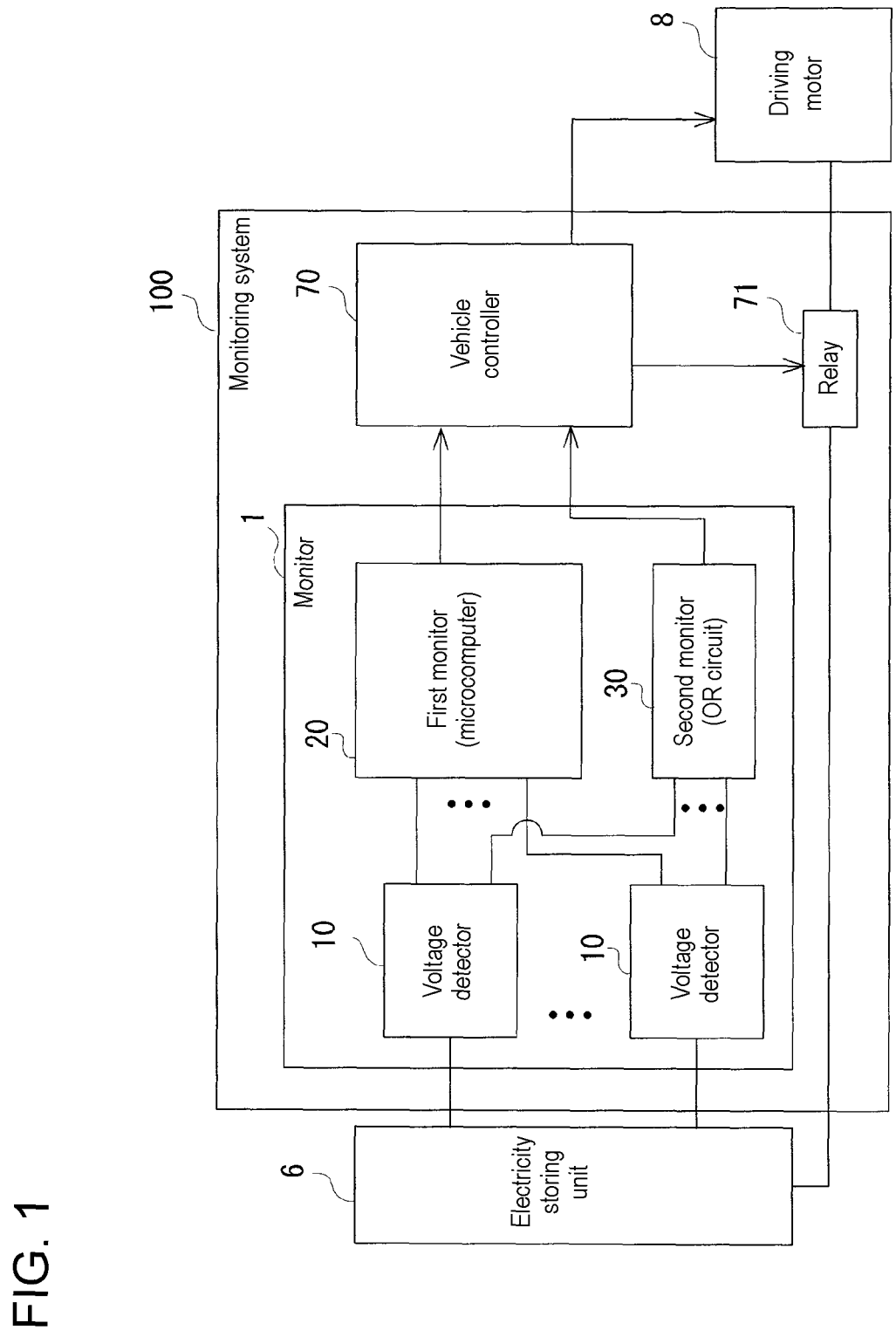
FIG. 1 is a block diagram that illustrates a configuration of a monitoring system according to an exemplary embodiment.

Hereinafter, the present invention will be described based on a preferred exemplary embodiment with reference to FIGS. 1 to 6. Same reference marks are assigned to same or equivalent components and members illustrated in the drawings. Explanation for the same or equivalent components and members will not be repeated as appropriate. Dimensions of members in the drawings are appropriately enlarged or reduced to facilitate understanding. Some members that are not important for explanation of the exemplary embodiment are not illustrated in the drawings.

Exemplary Embodiment

FIG. 1 is a block diagram that illustrates a configuration of monitoring system 100 according to an exemplary embodiment. Monitoring system 100 includes monitor 1, vehicle controller 70, and relay 71. Vehicle controller 70 controls relay 71, based on signals input into vehicle controller 70 from monitor 1 Vehicle controller 70 also monitors a state of electricity storing unit 6 attached to a vehicle, and controls operation of driving motor 8 operated by electricity storing unit 6. Electricity storing unit 6 includes a plurality of electricity storing cells 61 (see FIG. 2), e.g. lithium-ion cells, connected in series. Instead of the lithium-ion cells, electricity storing cells 61 may be nickel-hydrogen cells, lead-acid cells, electric-double-layer capacitor, or lithium-ion-capacitor.

Monitor 1 includes a plurality of voltage detectors 10, first monitor 20, and second monitor 30. Each of voltage detectors 10 detects a voltage of electricity storing unit 6, and detects whether or not abnormality due to overcharge or overdischarge occurs, and outputs the detection to first monitor 20 and second monitor 30. First monitor 20 notifies vehicle controller 70 of a fact that abnormality occurs or does not occur in electricity storing unit 6, and a fact that a circuit failure occurs or does not occur in voltage detectors 10. Second monitor 30 notifies vehicle controller 70 of a fact that abnormality occurs or does not occur in electricity storing unit 6. Based on the notifications from first monitor 20 and second monitor 30, vehicle controller 70 electrically connects driving motor 8 with electricity storing unit 6 by closing relay 71, or electrically disconnects driving motor 8 from electricity storing unit 6 by opening relay 71, and operates driving motor 8.

Figure 2:
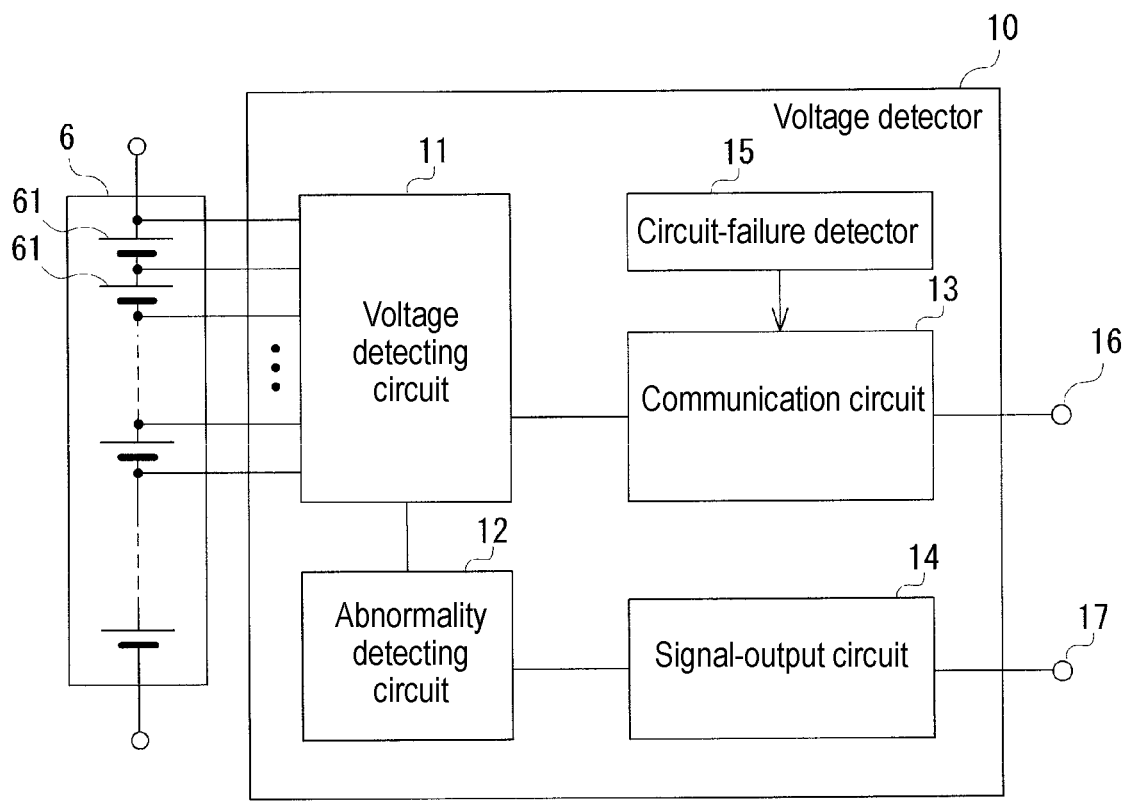
FIG. 2 is a block diagram that illustrates a configuration of one of voltage detectors.

FIG. 2 is a block diagram that illustrates a configuration of one of voltage detectors 10. Each of voltage detectors 10 includes voltage detecting circuit 11 that detects a voltage of electricity storing unit 6, abnormality detecting circuit 12, communication circuit 13, signal-output circuit 14, and circuit-failure detector 15. Each of voltage detectors 10 includes an application specific integrated circuit (ASIC), for example. Voltage detecting circuit 11 detects a voltage across each of a plurality of electricity storing cells 61 of electricity storing unit 6 that includes the plurality of electricity storing cells 61 connected in series. Alternatively, voltage detecting circuit 11 detects a voltage across a block of at least two adjacent electricity storing cells 61.

Abnormality detecting circuit 12 compares a voltage detected by voltage detecting circuit 11 with predetermined thresholds to detect whether or not abnormality due to overcharge or overdischarge occurs. If a detected voltage is higher than an overcharge threshold that is an upper limit of a normal range, abnormality detecting circuit 12 detects abnormality due to overcharge. If a detected voltage is lower than an overdischarge threshold that is a lower limit of the normal range, abnormality detecting circuit 12 detects abnormality due to overdischarge. If a detected voltage is normal, abnormality detecting circuit 12 outputs a high level as the abnormal voltage signal. If overcharge or overdischarge is detected, abnormality detecting circuit 12 outputs a low level as the abnormal voltage signal.

Communication circuit 13 transmits, to first monitor 20 connected to first output terminal 16, a voltage detected by voltage detecting circuit 11 and information on a circuit failure detected by circuit-failure detector 15. For example, communication circuit 13 is connected to first monitor 20, an isolator isolates communication circuit 13 from first monitor 20, and communication circuit 13 transmits information to first monitor 20 by means of serial communication. For example, communication circuit 13 is a circuit that uses a serial peripheral interface (SPI) communication scheme to communicate with outside.

Signal-output circuit 14 outputs, to second output terminal 17, abnormal voltage signals from abnormality detecting circuit 12. If a detected voltage is normal, second output terminal 17 outputs a high level (5 V) as an abnormal voltage signal. If overcharge or overdischarge is detected, second output terminal 17 outputs a low level (0 V) as an abnormal voltage signal. Second monitor 30 is connected to second output terminal 17, and receives, through second output terminal 17, abnormal voltage signals output from abnormality detecting circuit 12.

Circuit-failure detector 15 detects circuit failures in the circuits in voltage detector 10. Circuit-failure detector 15 detects circuit failures, such as a breakage of connection lines that connect voltage detecting circuit 11 with electricity storing unit 6, an error in accuracy of a voltage measured by voltage detecting circuit 11, and an error in a comparison circuit that is in abnormality detecting circuit 12 and is for comparison with the thresholds. Circuit-failure detector 15 also detects circuit failures, such as a communication error in communication circuit 13, and a signal-output error in signal-output circuit 14. Communication circuit 13 transmits, to first monitor 20, information on a circuit failure detected by circuit-failure detector 15.

FIG. 3 is a table that illustrates information first monitor 20 and second monitor 30 each receive from voltage detectors 10. First monitor 20 communicates with voltage detectors 10 to receive voltages detected by voltage detectors 10 and information on a circuit failure in voltage detectors 10. First monitor 20 includes a microcomputer, functions by executing a program stored in a memory circuit included in first monitor 20, and performs processing by means of software. First monitor 20 monitors voltages detected by voltage detectors 10, and determines whether or not the voltages detected by voltage detectors 10 are within a normal range. First monitor 20 monitors whether or not a circuit failure occurs in a circuit system on a side of first output terminal 16 and in a circuit system on a side of second output terminal 17. Based on information on a circuit failure first monitor 20 receives from first output terminal 16, first monitor 20 determines a circuit failure at any position in a circuit system that includes voltage detecting circuit 11 and communication circuit 13, and determines whether or not a circuit failure occurs in a circuit on the side of first output terminal 16. Based on information on a circuit failure first monitor 20 receives from first output terminal 16, first monitor 20 determines a circuit failure at any position in a circuit system that includes voltage detecting circuit 11, abnormality detecting circuit 12, and signal-output circuit 14, and determines whether or not a circuit failure occurs in a circuit on the side of second output terminal 17. First monitor 20 notifies vehicle controller 70 of results of monitoring that are a fact that an abnormal voltage occurs or does not occur and a fact that a circuit failure occurs or does not occur.

Second monitor 30 receives, through second output terminals 17 of voltage detectors 10, abnormal voltage signals output from abnormality detecting circuits 12 of voltage detectors 10. Second monitor 30 receives abnormal voltage signals from the plurality of voltage detectors 10, uses a logical-sum-operation circuit to obtain a logical sum, and outputs a signal that means or shows that abnormality occurs if any voltage detector 10 inputs an abnormal voltage signal (abnormality occurs) to second monitor 30. Second monitor 30 includes connection lines and discrete components, and performs processing by means of hardware. The processing performed by means of hardware does not involve processing by means of program. Second monitor 30 notifies vehicle controller 70 of a result of monitoring that is a fact that an abnormal voltage occurs or does not occur.

Next, operation of the monitoring system will be described.

Figure 4:
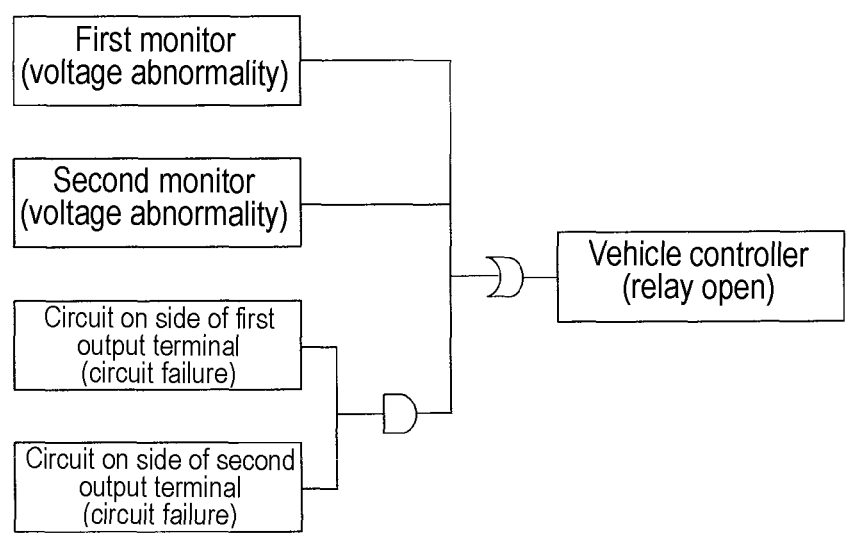
FIG. 4 is a logical tree that illustrate a logical operation by a vehicle controller to open or close a relay.

FIG. 4 is a logical tree that illustrates a logical operation by vehicle controller 70 to open or close the relay. As input into vehicle controller 70, first monitor 20 and second monitor 30 each notify vehicle controller 70 of a fact that an abnormal voltage occurs or does not occur in electricity storing unit 6, and a fact that a circuit failure occurs or does not occur in the circuit on a first output terminal 16 side and the circuit on the side of second output terminal 17. Consequently, vehicle controller 70 opens relay 71 and thus disconnects driving motor 8 from electricity storing unit 6. Vehicle controller 70 uses a logical sum to calculate an abnormal voltage in electricity storing unit 6, and opens relay 71. First monitor 20 and second monitor 30 notify vehicle controller 70 of the abnormal voltage in electricity storing unit 6. That is, if one of first monitor 20 and second monitor 30 notifies a fact that an abnormal voltage occurs in electricity storing unit 6, or both first monitor 20 and second monitor 30 notify a fact that an abnormal voltage occurs in electricity storing unit 6, vehicle controller 70 opens relay 71.

Further, vehicle controller 70 uses a logical product to calculate a circuit failure in the circuit on the side of first output terminal 16 and the circuit on the side of second output terminal 17. Such a circuit failure is informed from first monitor 20. Vehicle controller 70 uses the calculated circuit failure as an input into the logical sum described before, and opens relay 71. That is, if a circuit failure occurs in each of the circuit on the side of first output terminal 16 and the circuit on the side of second output terminal 17, vehicle controller 70 opens relay 71. If a circuit failure only occurs in one of the circuit on the side of first output terminal 16 and the circuit on the side of second output terminal 17, vehicle controller 70 keeps relay 71 closed, and connects driving motor 8 with electricity storing unit 6. Consequently, monitoring system 100 does not increase a size of a circuit that monitors electricity storing unit 6, and allows a vehicle to continue to drive.

First monitor 20 receives information (voltages and information on a circuit failure) output from communication circuits 13 of voltage detectors 10 through first output terminals 16. On the other hand, second monitor 30 receives information (abnormal voltage signals) output into second output terminals 17 from signal-output circuits 14 of voltage detectors 10. Vehicle controller 70 receives, from first monitor 20, a fact that a circuit failure occurs or does not occur in the circuit on the side of first output terminal 16 and the circuit on the side of second output terminal 17.

FIG. 5 is a table that illustrates contents of procedures of vehicle controller 70, and the procedures of vehicle controller 70 correspond to monitored states, respectively. When a circuit failure (X in FIG. 5) only occurs in one of the circuit on the side of first output terminal 16 and the circuit on the side of second output terminal 17, vehicle controller 70 keeps relay 71 closed, but limits operation of driving motor 8.

Consequently, when a circuit failure occurs in one of the circuit on the side of first output terminal 16 and the circuit on the side of second output terminal 17, monitoring system 100 limits operation but allows a vehicle to continue to drive.

In an example illustrated in FIG. 5, vehicle controller 70 limits output torque of driving motor 8 to limit an electric discharge of electricity storing unit 6. Alternatively, vehicle controller 70 may limit a duration for which driving motor 8 operates or a driving distance. If a circuit failure occurs in each of the circuit on the side of first output terminal 16 and the circuit on the side of second output terminal 17, vehicle controller 70 opens relay 71, and stops operation of driving motor 8. Alternatively, when one of first monitor 20 and second monitor 30 notifies vehicle controller 70 of a fact that an abnormal voltage (X in FIG. 5) occurs, or each of first monitor 20 and second monitor 30 notifies vehicle controller 70 of a fact that an abnormal voltage occurs, vehicle controller 70 opens relay 71, and stops operation of driving motor 8.

When a circuit failure does not occur in the circuit on the side of first output terminal 16, and a circuit failure occurs in the circuit on the side of second output terminal 17, vehicle controller 70 may limit operation to a degree that is lower than a degree to which vehicle controller 70 limits operation when a circuit failure occurs in the circuit on the side of first output terminal 16, and a circuit failure does not occur in the circuit on the side of second output terminal 17. First monitor 20 includes the microcomputer as described before. Then, if a circuit failure occurs in the circuit on the side of second output terminal 17, first monitor 20 is flexible to increase an accuracy of monitoring by means of processing program that deals with the circuit failure, for example. Limiting operation to a lower degree means that output torque of driving motor 8 is set stronger, and a duration for which driving motor 8 operates or a driving distance is set further, for example, compared with a case in which operation is limited to a higher degree. Consequently, monitoring system 100 varies limitation of operation of driving motor 8, according to monitored states. Consequently, monitoring system 100 allows a vehicle to continue to drive further.

Modified Example

In the above exemplary embodiment, abnormality detecting circuit 12 of each of voltage detectors 10 receives, from voltage detecting circuit 11, a voltage of electricity storing unit 6, and detects an abnormal voltage. However, abnormality detecting circuit 12 may be in a system that is independent from a system that includes voltage detecting circuit 11, and detect independently a voltage of electricity storing unit 6, and may detect an abnormal voltage.

Consequently, first monitor 20 and second monitor 30 are independent from each other.

Second monitor 30 notifies vehicle controller 70 of an abnormal voltage. However, second monitor 30 itself may also determine a circuit failure, and notify vehicle controller 70 of the circuit failure. For example, second monitor 30 receives, from voltage detectors 10, voltages of electricity storing unit 6 and abnormal voltage signals. FIG. 6 is a table that illustrates examples of determination of circuit failures each based on voltages and an abnormal voltage in a modified example.

As illustrated in case #1 in the table of FIG. 6, when second monitor 30 receives, from voltage detectors 10, abnormal voltage signals that mean that abnormality does not occur, and second monitor 30 receives, from voltage detectors 10, voltages of electricity storing unit 6 that are within a normal range, second monitor 30 determines normality. As illustrated in case #2 in the table of FIG. 6, when second monitor 30 receives, from voltage detectors 10, abnormal voltage signals that mean that abnormality does not occur, and second monitor 30 receives, from voltage detectors 10, voltages of electricity storing unit 6 that are out of the normal range, second monitor 30 determines that a circuit failure occurs.

As illustrated in case #3 in the table of FIG. 6, when second monitor 30 receives, from voltage detectors 10, abnormal voltage signals that mean that abnormality occurs, and second monitor 30 receives, from voltage detectors 10, voltages of electricity storing unit 6 that are within the normal range, second monitor 30 determines that a circuit failure occurs. As illustrated in case #4 in the table of FIG. 6, when second monitor 30 receives, from voltage detectors 10, abnormal voltage signals that mean that abnormality occurs, and second monitor 30 receives, from voltage detectors 10, voltages of electricity storing unit 6 that are out of the normal range, second monitor 30 determines that an abnormal voltage occurs. Such determination of second monitor 30 is processed by a circuit that includes an analog-to-digital (AD) converter that converts an analog signal into a digital signal, and discrete components, such as a comparator. Therefore, such determination of second monitor 30 is processed by hardware, and does not include processing by means of program.

Second monitor 30 notifies vehicle controller 70 of determination of whether or not a circuit failure occurs. This determination of whether or not a circuit failure occurs represents a circuit failure in the circuit on the side of second output terminal 17. Vehicle controller 70 may determine limitation of operation of driving motor 8, based on a fact that a circuit failure occurs or does not occur in the circuit on the side of second output terminal 17.

The present invention has been described based on the exemplary embodiment of the present invention. As a person skilled in the art understands, the exemplary embodiment is exemplified, and the exemplary embodiment is variously varied and modified within a scope of claims of the present invention. Further, such variations and modifications fall within the scope of the claims of the present invention. Therefore, it should be understood that the description and the drawings herein are not limitative, but are illustrative.

The exemplary embodiment may be defined by the following items.

[Item 1]

Monitoring system (100) that includes:

voltage detector (10) that detects a voltage of electricity storing unit (6) attached to a vehicle, and includes first output terminal (16) that outputs the detected voltage and information on a circuit failure in a circuit of voltage detector (10), and second output terminal (17) that outputs an abnormal voltage signal that shows that the detected voltage is abnormal or is not abnormal;

first monitor (20) that is connected to first output terminal (16), and receives the voltage and the information on a circuit failure that are output by first output terminal (16);

second monitor (30) that is connected to second output terminal (17), and receives the abnormal voltage signal output by second output terminal (17); and vehicle controller (70) that electrically disconnects driving motor (8) from electricity storing unit (6), based on notifications from first monitor (20) and second monitor (30), wherein when a circuit failure occurs in both of a circuit on a side of the first output terminal (16) and a circuit on a side of the second output terminal (17), vehicle controller (70) disconnects driving motor (8) from electricity storing unit (6), or when a circuit failure occurs in one circuit of the circuits and a circuit failure does not occur in the other circuit, and electricity storing unit (6) is normal, vehicle controller (70) connects driving motor (8) with electricity storing unit (6). Consequently, when a circuit failure occurs in only one circuit of the circuit on the side of first output terminal (16) and the circuit on the side of second output terminal (17), monitoring system (100) allows a vehicle to continue to drive.

[Item 2]

Monitoring system (100) according to item 1, wherein when a circuit failure occurs in one circuit of the circuits of the circuit on the side of the first output terminal (16) and the circuit on the side of the second output terminal (17) and a circuit failure does not occur in the other circuit of the circuit, vehicle controller (70) limits operation of driving motor (8). Consequently, monitoring system (100) allows a vehicle to continue to drive although monitoring system (100) limits operation of driving motor (8).

[Item 3]

Monitoring system (100) according to item 2, wherein when a circuit failure does not occur in the circuit on the side of the first output terminal (16), and a circuit failure occurs in the circuit on the side of the second output terminal (17), vehicle controller (70) limits operation of driving motor (8) to a degree that is lower than a degree to which vehicle controller (70) limits operation of driving motor (8) when a circuit failure occurs in the circuit on the side of first output terminal (16), and a circuit failure does not occur in the circuit on the side of the second output terminal (17). Accordingly, monitoring system (100) varies limitation of operation of driving motor (8), according to monitored states. Consequently, monitoring system (100) allows a vehicle to continue to drive further.

The invention claimed is:

1. A monitoring system comprising:
a voltage detector that detects a voltage of an electricity storing unit attached to a vehicle, and includes a first output terminal that outputs the detected voltage and information on a circuit failure of the voltage detector, and a second output terminal that outputs an abnormal voltage signal that shows that the detected voltage is abnormal or is not abnormal;
a first monitor that is connected to the first output terminal, and receives the voltage and the information on a circuit failure that are output by the first output terminal;
a second monitor that is connected to the second output terminal, and receives the abnormal voltage signal output by the second output terminal; and
a vehicle controller that electrically disconnects a driving motor from the electricity storing unit, based on notifications from the first monitor and the second monitor,
wherein when a circuit failure occurs in both of a circuit on a side of the first output terminal and a circuit on a side of the second output terminal, the vehicle controller disconnects the driving motor from the electricity storing unit, or when a circuit failure occurs in one circuit of the circuits and a circuit failure does not occur in another circuit, and the electricity storing unit is normal, the vehicle controller connects the driving motor with the electricity storing unit.

2. The monitoring system according to claim 1, wherein when a circuit failure occurs in one circuit of the circuits on the side of the first output terminal and on the side of the second output terminal and a circuit failure does not occur in the another circuit of the circuits, the vehicle controller limits operation of the driving motor.

3. The monitoring system according to claim 2, wherein when a circuit failure does not occur in the circuit on the side of the first output terminal, and a circuit failure occurs in the circuit on the side of the second output terminal, the vehicle controller limits operation of the driving motor to a degree that is lower than a degree to which the vehicle controller limits operation of the driving motor when a circuit failure occurs in the circuit on the side of the first output terminal, and a circuit failure does not occur in the circuit on the side of the second output terminal.

\* \* \* \* \*